United States Patent [19]

Haken

[11] Patent Number: 4,613,885
[45] Date of Patent: Sep. 23, 1986

[54] HIGH-VOLTAGE CMOS PROCESS

[75] Inventor: Roger A. Haken, Richardson, Tex.

[73] Assignee: Texas Instruments Incorporated, Dallas, Tex.

[21] Appl. No.: 570,321

[22] Filed: Jan. 12, 1984

Related U.S. Application Data

[63] Continuation of Ser. No. 344,588, Feb. 1, 1982, Pat. No. 4,442,591.

[51] Int. Cl.[4] .................. H01L 29/78; H01L 21/265; H01L 21/76
[52] U.S. Cl. .................................. 357/42; 357/23.11; 357/52; 29/571; 29/578; 29/576 B; 148/1.5; 148/188
[58] Field of Search .............. 29/571, 578, 576 B, 29/576 E; 148/1.5, 187, 188, 190; 357/42, 44, 23.11, 52

[56] References Cited

U.S. PATENT DOCUMENTS

| | | | |
|---|---|---|---|
| 3,956,035 | 5/1976 | Herrmann | 29/576 E X |
| 3,983,620 | 10/1976 | Spadea | 29/578 X |
| 4,013,484 | 3/1977 | Boleky et al. | 148/1.5 |
| 4,135,955 | 1/1979 | Gasner et al. | 29/571 X |
| 4,223,334 | 9/1980 | Gasner et al. | 357/48 X |
| 4,277,291 | 7/1981 | Cerofolini et al. | 148/188 X |
| 4,385,947 | 5/1983 | Halfacre et al. | 29/571 X |
| 4,391,650 | 7/1983 | Pfeifer et al. | 148/187 X |

*Primary Examiner*—Brian E. Hearn
*Assistant Examiner*—David A. Hey
*Attorney, Agent, or Firm*—Robert Groover, III; Douglas A. Sorensen; Melvin Sharp

[57] ABSTRACT

A high-voltage CMOS process, providing (for 5 micron geometries) both field thresholds and junction breakdowns in excess of 20 volts, wherein only one channel stop implant is used. A double-well process in an epitaxial structure is used. Phosphorus is preferably used as the dopant for the N-tank, and boron is used for the blanket channel stop implant. The boron tends to leach into oxide, and the phosphorus tends to accumulate at the surface, and a high field threshold is achieved over both PMOS and NMOS regions.

11 Claims, 8 Drawing Figures

HIGH-VOLTAGE CMOS PROCESS

This a continuation of application Ser. No. 344,588, filed Feb. 1, 1982, now U.S. Pat. No. 4,442,591.

BACKGROUND OF THE INVENTION

The present invention relates to a CMOS process which yields high-voltage devices.

High-voltage CMOS devices are highly desirable for many applications, including display drivers, nonvolatile memories, communications circuits, and control circuits, particularly where low power consumption is desired. However, a difficulty in the prior art has been that high-voltage CMOS processes would use a very large number of masks.

Thus, it is an object of the present invention to provide a high-voltage CMOS process with a low mask count for reasonably small geometries.

It is a further object of the present invention to provide a CMOS process suitable for 15 volt operation with 5 micron geometries which has a low mask count.

It is a further object of the present invention to provide a double-poly high-voltage CMOS process using 9 or fewer masks.

It is particularly desirable to provide a process for CMOS circuits having an operating voltage of 10 volts or higher, since conventional CMOS processes cannot be directly scaled to such levels.

SUMMARY OF THE INVENTION

The present invention discloses a high-voltage CMOS process, providing (for 15 V circuits) both field thresholds and junction breakdowns in excess of 20 volts, wherein only one channel stop implant is used. A double-well process in an epitaxial structure is used. Phosphorus is used as the dopant for the N-tank, and boron is used for the blanket channel stop implant. The heavy boron implant tends to reduce the field threshold over the N-tank, but the boron tends to leach into oxide, the phosphorus tends to accumulate at the surface, and advantageous $Q_{SS}/C_{OX}$ voltage is provided by charge trapped in the oxide over PMOS regions, and a high field threshold is thus achieved over both PMOS and NMOS regions. The inventive process is directly scalable to operating voltages between 10 and 20 volts.

According to the present invention, there is provided:

a high-voltage CMOS process, comprising the steps of:
  providing a silicon surface;
  providing N-type device regions in said surface;
  providing P-type device regions in said surface;
  depositing a moat masking layer on respective moat areas of said N-type and P-type device regions;
  applying a channel stop implant overall, said channel stop implant comprising at least $5 \times 10^{12}$ cm$^{-2}$ of boron at an energy of at least 45 keV;
  selectively oxidizing said silicon surface where not masked by said moat masking layer;
  stripping said moat masking layer; and
  forming desired NMOS and PMOS devices in said respective moat regions.

BRIEF DESCRIPTION OF THE DRAWINGS

The present invention will be described with respect to the accompanying drawings, wherein.

DESCRIPTION OF THE PREFERRED EMBODIMENTS

Figure 1:
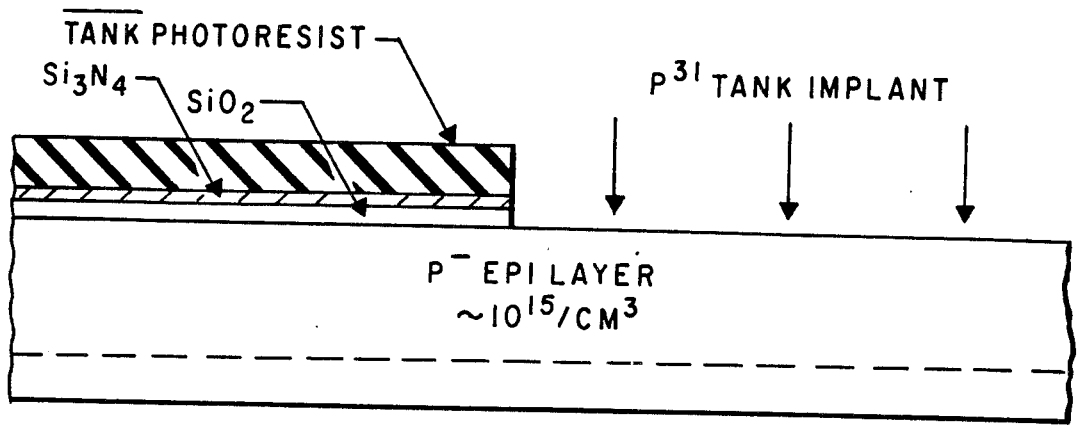
FIGS. 1 through 8 illustrate the sequence of steps in the high-voltage CMOS process of the present invention.

The present invention will be described with the primary reference to a process which is optimized for a device which will operate at 15 volts, so that breakdown voltages and field thresholds of 20 volts or better are required. In this preferred embodiment, 5 micron design rules are used. However, the present process also scales directly to lower voltage operation at smaller geometries, for example to 10-volt operation at 3 micron geometries.

The present invention uses a P-on-P+ structure, with both a P-well and an N-tank being implanted within the P-epitaxial layer. The innovative process as presently practiced is optimized for 15 volt operation with 5 micron gate lengths, but scaling to, e.g., 10 volt operation with 3 micron gate lengths is straightforward.

The present invention permits a 9 mask double-poly process using positive resist, or a 10 mask process using negative resist (since two masking steps are used to form the contact level). Algorithmic mask generation reduces the number of drawn levels to 8, and permits contact to the tank to be made using the N+ source/drain implant, and contact to the P-well using the P+ source/drain implant. The N+ and P+ S/D masks are both generated from a drawn N+/P+ mask and the tank mask. A single-poly process according to the present invention uses only 8 masks, and use of source/drain counterdoping requires only 7 masks total. The starting material is a P+ substrate, doped to about $10^{18}$ per cm$^3$, with a 16 micron thick P-type epitaxial layer thereon, doped to about $10^{15}$ per cm$^3$. Evaluation of latchup performance using the process of the present invention indicates that 16 micron epi gives adequate latchup protection for 15 volt operation of internal circuits. For I/O circuits, further protection can be achieved by the addition of guard rings which are implanted with the N+ source/drain implant. Although this requires the use of metal jumpers in the I/O circuits to permit a poly line to cross between P and N channel devices, the area penalty is very small as a percentage of chip size. By providing guard ring structures only in the I/O circuits, which are more likely to receive externally generated high-voltage transients, good resistance to high-voltage transients is provided without significantly increased process complexity or area inefficiency.

Two layers of poly are used, with a regrown gate oxide. The first polysilicon level can be doped by ion implantation, and is therefore suitable for capacitor bottom plates and for natural $V_T$ transistors. In addition, resistors can be formed in this first poly level. The first poly level is also useful in forming a nonvolatile transistor, as will be discussed below. The second level of polysilicon is used for regular gates and interconnects. This level is preferably silicided by the coevaporation of titanium and silicon, so that the sheet resistance of the second poly layer is effectively reduced to around 5 ohms per square. This avoids the difficult compromise between resistivity and etching characteristics which is otherwise necessary. When polysilicon is POCl$_3$ doped to below about 50 ohms per square, plasma etching tends to proceed selectively along grain boundaries, in effect removing the polysilicon in chunks. Polysilicon having 50 ohms per square sheet resistance is bad enough for circuit design, but portions of the poly will be exposed to the P-type source/drain implant, and therefore have an even higher sheet resistance. Siliciding the second poly level avoids the sheet resistance problem, and siliciding by means of co-deposition of titanium and silicon adds almost no additional process complexity.

The final P-channel (N-tank) surface concentration is around $10^{16}$ per $cm^3$, and the tank depth is about 4 microns. With a gate oxide thickness of 70 nm, the resulting body effect is about 1.4 $V^{\frac{1}{2}}$, and the Kp is 5 microamps per $volt^2$. For the majority of circuit designs, the high P-channel body effect is not an issue, since the N-tank can always be returned to the source.

The final N-channel (P-well) surface concentration is around $2 \times 10^{15}$ per $cm^3$, with a resulting body effect of 0.4 $V^{\frac{1}{2}}$ and a Kp of 16 microamp per $volt^2$.

A blanket boron implant is used to simultaneously set the $V_{TN}$ (the NMOS threshold voltage) and $V_{TP}$ to plus and minus 1.5 volt. A blanket implant can be used to symmetrize the PMOS and NMOS threshold voltages at only one voltage level, and plus and minus 1.5 volts happen to be paired values conveniently available with the process parameters specified.

The PMOS and NMOS field thresholds are both around 22 volts or greater. This is achieved with a 1.1 micron field oxide, and a blanket boron field threshold adjust implant. The initial field threshold in PMOS regions is higher than required, and the threshold adjust implant dose is selected to equalize the field threshold in PMOS and in NMOS regions. With doping levels as described above, the field threshold levels are equalized at around 22 through 25 volts. Thus, no masking step is required for field threshold adjustment.

The PMOS and NMOS source/drains are implanted with boron and with phosphorus/arsenic respectively, yielding junction depths around 0.75 micron with junction breakdown voltages around 23 volts.

The mask set of the preferred embodiment is therefore as follows:

TABLE 1

Twin Tub, 15 V, Two-Level Poly CMOS - Mask Set

| Mask Name | Function |
|---|---|
| 1. Tank | Defines P-channel regions and can be used for resistors. |
| 2. Moat | Defines moat pattern for active devices and N+ guard rings for I/O circuits. |
| 3. Poly 1 | Used for precision capacitor bottom electrodes interconnect and natural $V_T$ transistors. |
| 4. Poly 2 | Used for regular transistors, capacitor top electrodes and interconnect. |
| 5. N+ S/D | N-channel S/D, N+ guard ring for I/O circuits and tank contact. |
| 6. P+ S/D | P-channel S/D and local P-substrate contact. |
| 7. CTOR | Contact to all poly gates and moat. |
| 8. Metal | Full level of interconnect. |
| 9. POR | Protective overcoat. |

The baseline process flow for the high voltage CMOS process is illustrated in FIGS. 1–8. Starting material is a P+ substrate, doped to about $10^{18}$ per $cm^3$, with a 16 micron epitaxial P-type layer, doped to around $10^{15}$ per $cm^3$. The thickness of the epitaxial layer is controlled by two factors: First, the thicker the layer, the less effective it will be in suppressing latchup; second, the minimum thickness of the epi-layer is determined by the supply voltage, such that with the N-tank at $V_{DD}$ (+15 V) and the P-substrate (epi) at OV, the depletion region extending from the tank does not quite reach the P+ substrate. This minimizes the depletion region extending into the tank, thereby increasing the P+ punch thru voltage, and ensures that no voltage is dropped across the P+ substrate which could cause breakdown because of the high fields. Moreover, the thinner the layer, the greater the leakage current and capacitative coupling into the substrate may be. The epitaxial layer doping is selected as discussed in U.S. patent application Ser. No. 327,661, filed Dec. 4, 1981, now abandoned, which is hereby incorporated by reference.

The gain (beta) product of parasitic bipolar transistors produced by the present process is greater than unity, so that avoidance of latch-up depends on never reaching the necessary injection current. This is averted by current leakage through the substrate: the lower the resistance of this leakage path, the more any current surge will be shunted. Lateral spacings which safely avoid latch-up are, in the 15 V 5 micron case: 5 microns tank-to-N+, and 7 microns tank-to-P+. These scale directly with device geometry.

A 50 nm initial oxide is grown, and 140 nm of silicon nitride is deposited. These layers are etched using the tank-complement image, and the N-tank is implanted, using e.g. $5 \times 10^{12}$ per $cm^2$ of phosphorus at 80 keV. This yields the structure of FIG. 1.

Figure 2:
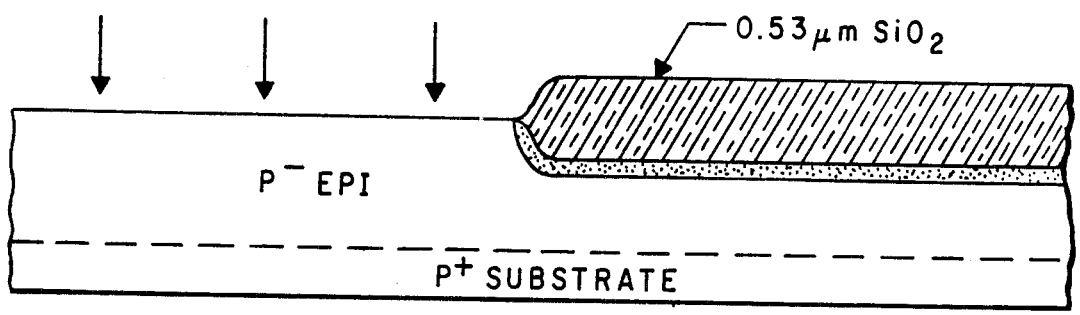
Figure 3:
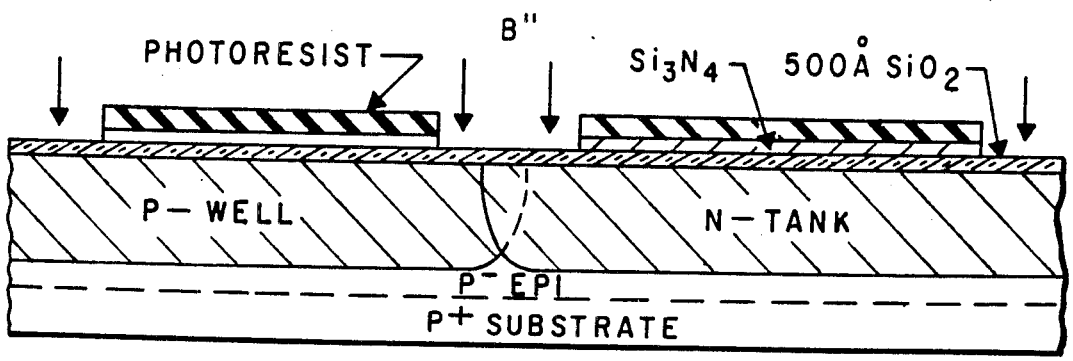
Figure 4:
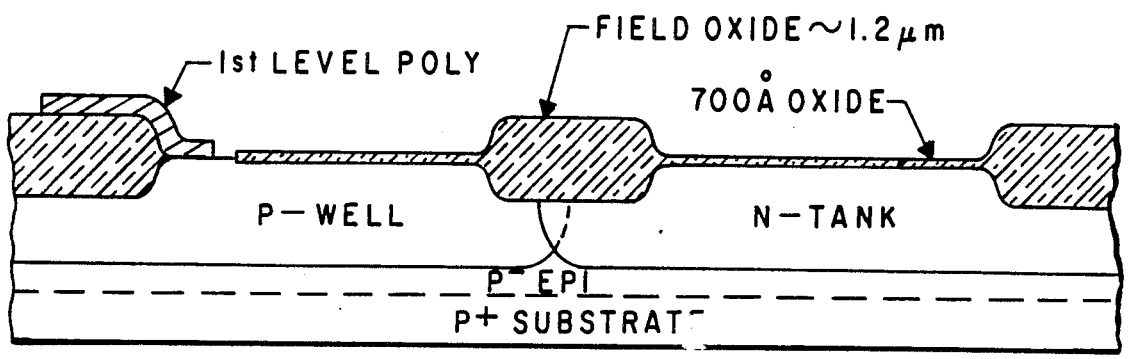
Figure 5:
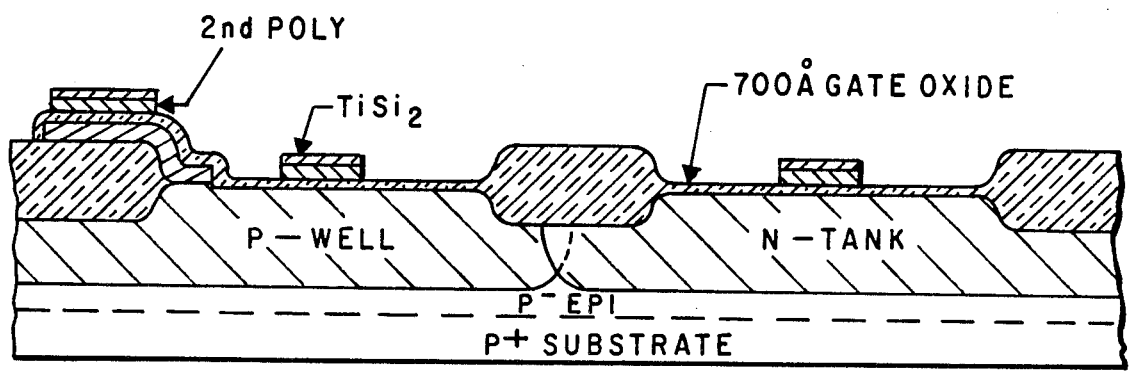

An oxide of e.g. 530 nm is grown in the N-tank region to act as a mask against the P-well implant which follows, and to act as a locater for subsequent alignments. The P-well region is then implanted with boron, at e.g. $4 \times 10^{11}$ per $cm^2$ at 60 keV, as shown in FIG. 2.

The tank oxide is stripped and the N-tank and P-well implants are driven in. A standard pad oxide is grown and nitride is deposited. The moat-complement image is cut in the nitride/oxide stack, and a blanket boron channel stop implant is performed, of e.g. $1.2 \times 10^{13}$ per $cm^2$ at 90 keV. This yields the structure shown in FIG. 3.

The photoresist is then stripped, and field oxidation is performed to yield an oxide thickness of about 1.2 microns. The nitride/oxide stack over the moat regions is then stripped. A desirable side effect of the field oxidation step is that the boron blanket channel stop implant can be used to raise the N-channel field threshold without overly reducing the P-channel field threshold, since the phosphorus concentration in the N-tank accumulates at the surface during the field oxidation step, whereas much of the boron in the P-well is leached into the oxide. Moreover, for the P-channel devices $Q_{SS}$ (the charge trapped in the oxide), which is always positive, increases the field threshold. This effect is particularly favorable for thick oxides, where the oxide capacitance $C_{OX}$ is necessarily small, since the voltage due to trapped charge in the oxide is $V_{SS}=Q_{SS}/C_{OX}$.

A 25 nm pre-gate oxide is then formed, to eliminate the "Kooi effect", and the pre-gate oxide is etched. A first gate oxide is then grown to a thickness of 70 nm. Optionally, a first contact pattern may also be etched at this point. A 500 nm thick first poly level is then deposited, and can be doped by using a phosphorus implant, e.g. $5 \times 10^{15}$ per $cm^2$ at 85 keV. This first level of poly is primarily intended as the bottom plate for precision poly-to-poly capacitors, as required in analog signal processing. It may also be used to form natural $V_T$ transistors, and can be used for very short interconnections, since its final sheet resistance inside the N-tank is around 150 ohms per square, and about 40 ohms per square outside the tank. (The difference is due to the counterdoping effect of the boron source/drain implant.) If a first contact is required, it can be included between the moat and first poly level.

The first poly level is then patterned and plasma etched, and the exposed gate oxide is wet etched. A second gate oxide, also 70 nm thick, is then grown in $O_2 + 5\%$ HCl. Atop the exposed first polysilicon areas, the first poly insulation oxide is simultaneously grown, to 110 nm thick. A boron blanket implant, of e.g. $5 \times 10^{11}$ per cm$^2$ at 40 keV, is used to adjust $V_{TN}$ and $V_{TP}$.

Optionally, for telecommunications circuits where depletion loads may be required (e.g. for source follower circuits), an additional masking step can be included at this stage of a depletion (phosphorus) implant.

Figure 6:
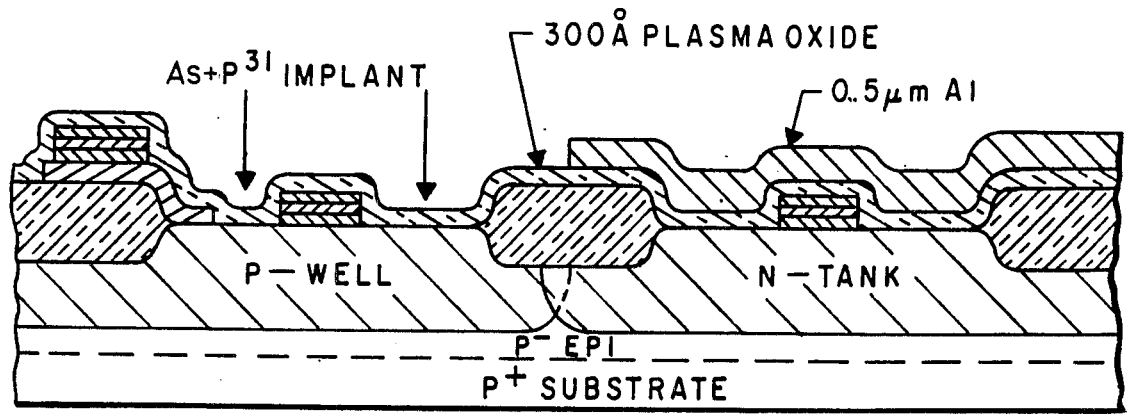

A 300 nm thick second poly layer is now deposited and doped. 200 nm of TiSi$_2$ is deposited by co-deposition of titanium and silicon. Preferably this is done by simultaneous E-beam co-evaporation of titanium and silicon. Alternately, co-sputtering or direct reaction can be used. The titanium silicide is then annealed, and the second poly level is patterned. (Wet etching must not be done after the silicide has been deposited). The silicide, polysilicon, and exposed gate oxide are then plasma etched, producing a configuration as shown in FIG. 6. If 2 layers of poly are not required, the second layer may be omitted, and the first poly layer silicided and used for gates.

30 nm of plasma oxide is then deposited, followed by 500 nm of aluminum. The N+ source/drain layout is patterned, and the aluminum is etched. Aluminum masking is used to prevent photoresist removal difficulties caused by the high implant dose used. The N+ source/drain implant is then performed, e.g. $8 \times 10^{15}$ per cm$^2$ of phosphorus at 40 keV, as shown in FIG. 6.

Alternatively, both arsenic and phosphorus may be implanted. In this alternative, the drain implant can include, e.g., $5 \times 10^{15}$ per cm$^2$ of phosphorus together with $5 \times 10^{15}$ per cm$^2$ of arsenic. The higher diffusivity of phosphorus means that it will diffuse to form a junction in advance of any large As concentration, so that, after annealing, the source/drain regions would have a graded regions of gradually lowered conductivity adjacent to the ends of the channels. This would mean that the gradient of the electric field potential would be reduced at the ends of the channels, and therefore secondary carrier generation by impact ionization would be greatly reduced. Thus, short channel effects are reduced by this procedure, as is the danger of hot carrier effects. The P diffusion also imparts a larger radius of curvature to the junctions, increasing the breakdown voltage, while the As doping provides a low contact resistance. Further details of this alternative step are contained in U.S. patent application Ser. No. 344,589, filed Feb. 1, 1982, now abandoned, simultaneously filed and of common assignee, which is hereby incorporated by reference.

Figure 7:
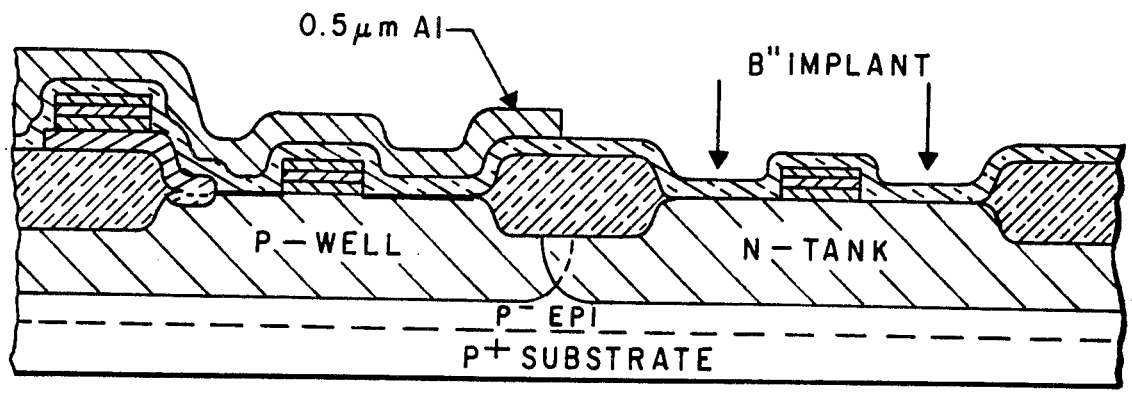

The PMOS source/drains are then aluminum-masked and similarly implanted, with $5 \times 10^{15}$ per cm$^2$ of BF$_2$ at 67 keV, as shown in FIG. 7. The aluminum masking is stripped, 50 nm of plasma oxide is deposited, and the source/drain implants are annealed and driven in. 650 nm of phospho-silicate glass is then deposited and reflowed at 975 C. The plasma oxide prevents the PSG from counter doping the PMOS source/drains during reflow.

A mask can be saved by source/drain counterdoping. In this alternative step, only the NMOS source/drains would be selectively formed (using an implant of As only, or of both As and P), and the PMOS source/drains would be formed by a boron implant applied to both types of source/drain regions. The boron dose is slightly reduced (e.g. to $3 \times 10^{15}$ cm$^{-2}$), and the As/P dose is slightly increased (e.g. to $1 \times 10^{16}$ cm$^{-2}$ of As and $3 \times 10^{15}$ cm$^{-2}$ of P). To provide a reasonably large radius of curvature at the PMOS source/drain junctions, the drive-in time may be increased. Further details relevant to this alternative step are set forth in U.S. patent application No. 311,684, filed 10/15/81, which is hereby incorporated by reference.

The second contact level is then patterned, using two resist coats if negative resist is being used. About a 500 nm thickness is wet etched, and the remainder is plasma etched. Plasma etching is required because of the different etch rates of PSG and plasma oxide.

Figure 8:
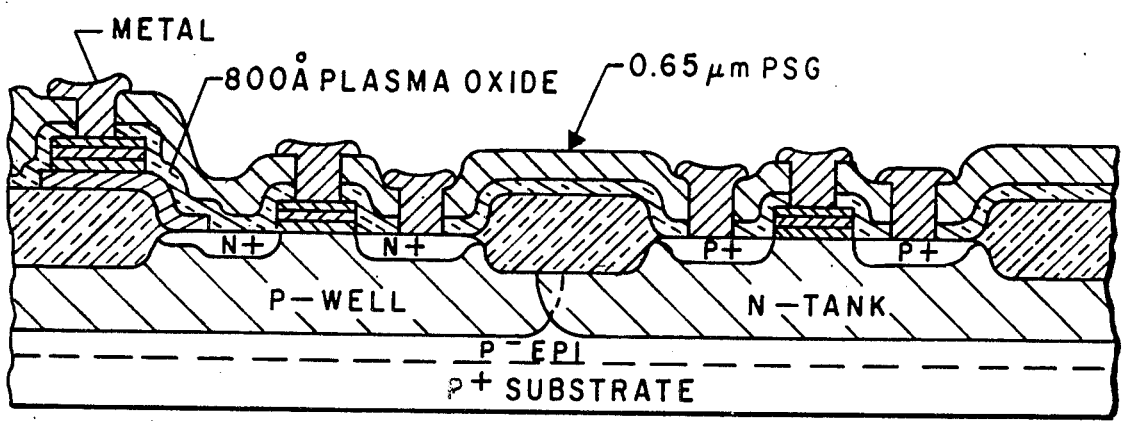

Finally, 40 nm of plasma polysilicon is deposited, followed by 1200 nm of aluminum. The aluminum is then patterned, etched, and sintered, as shown in FIG. 8. 300 nm of plasma nitride is then deposited. The protective overcoat (POR) pattern is then applied, and the nitride is etched.

The parameters resulting from the preferred process are as shown in Table 2:

TABLE 2

| Device/Circuit Parameter | Device and Circuit Parameters | |
|---|---|---|
| | N-Channel | P-Channel |
| $V_{TO}$ | 1.5 V | −1.5 V |
| $K_P (\mu A/V^2)$ | 16 | 5 |
| N (atoms/cm$^3$) | $2 \times 10^{15}$ | $1 \times 10^{16}$ |
| BE (V$^{\frac{1}{2}}$) | 0.4 | 1.2 |
| $V_{TF}$ | 22 V | −26 V |
| $V_{BR}$ | 22 V | 21 V |
| $C_{OX}$ (F/cm$^2$) | $4.9 \times 10^{-8}$ | |
| N+ S/D (sheet) | 28Ω/□ | |
| P+ S/D (sheet) | 55Ω/□ | |
| 1st Poly (outside tank) | 26Ω/□ | |
| 1st Poly (inside tank) | 90Ω/□ | |
| 2nd Poly (silicided) | <5Ω/□ | |
| Tank (sheet) | 2KΩ/□ | |

Among the distinctive features of the high-voltage CMOS process of the present invention, as particularly demonstrated in the 15-volt embodiment, are: 1. Only one channel top implant is used. 2. Low-resistivity tank dopings are used. 3. A deep tank is used, e.g. about 4 microns deep. 4. A thick epi layer is used. 5. Optionally, the P-well implant may be eliminated. However, this increases short-channel effects, e.g. source/drain punch through. 6. Optionally, a source/drain implant of both arsenic and phosphorus is used. The arsenic does provides a desirably low sheet resistance in the source and drain regions, and therefore a reduced series resistance in the device, while the phosphorus implant provides the desired gentle junction curvature. However, an increased arsenic dose appears to exacerbate impact ionization effects. 7. Optionally, source/drain counter doping is used, so that only one source/drain implant mask is required. 8. A single $V_T$ implant is used, to get both $V_T$ values down to around 1½ volt.

It will be obvious to those skilled in the art that a broad range of equivalents may be substituted in the present invention, specifically including, but not limited to, other CMOS improvements known in the art, such as referred to above.

For example, the inventive concepts disclosed and claimed herein may also be scaled for other operating voltages. For example, if the present invention is applied to fabricate 20 V circuits: (1) the basic device geometry is increased, e.g. to 7 microns. (This is a conservative figure, which can be reduced in a fully optimized process.) (2) A thicker field oxide is used, e.g. 1.4 micron, to raise the field threshold. (3) A deeper tank is used, e.g. 5 microns. (The tank dose and drive-in time are commensurately increased, to retain the same surface concentration.) (4) A thicker epi layer is used, e.g. 18–20 microns. (5) Deeper source/drains are used, e.g. 1–1.25 micron deep. (6) A thicker gate oxide can be used, e.g. 80 nm. The above parameters are interdependent, and may all be varied within the inventive process as claimed.

As another example, the process of the present invention can also be scaled to a 10 V process as follows, using 3–4 micron geometries. This embodiment is particularly well adapted to analog/digital circuits, especially telecommunications circuits.

The basic process flow can remain unchanged since it is already a two level poly technology, suitable for making precision capacitors and resistors. However, the additional masking step to include depletion mode N-channel devices, as discussed above is probably desirable.

The N-channel device substrate (P-well) of $2 \times 10^{15}/cm^3$ can be increased to $\sim 4 \times 10^{15}/cm^3$ in order to reduce short channel effects. However, this should only be done if the gate oxide thickness is also reduced to 60–65 nm, so as to kep the N-channel body effect down to $\sim 0.4$ $V^{\frac{1}{2}}$.

Both P- and N-channel field thresholds can be reduced to $\sim 16$ V, and this should be done by reducing the thickness of the field oxide to $\sim 8500°$ A. This will reduce moat encroachment and help reduce the body effect for narrow width devices.

Since the P+ and N+ junctions need only have a breakdown of $\sim 17$ V, the N+ diffusion can be arsenic at a dose of 0.5 to $1 \times 10^{16}/cm^2$. The P+ diffusion dose should remain the same, at about $5 \times 10^{15}/cm^2$, to ensure that the uncovered tank first level poly sheet resistance is not increased above $\sim 100\Omega/\square$. The junction depth of the P+ diffusions can be reduced to $\sim 0.5$ μm by reducing the drive-in time from about 40 min. at 975° C. to about 20 min. (20 min. is required to replace the PSG.)

If a 70 nm gate oxide is used, it will not be possible to simultaneously adjust $V_{TN}$ and $V_{TP}$ to $\pm 0.8$ V. (For a 10 V process lower thresholds are not recommended from a noise immunity point of view.) Preferably, however, the gate oxide thickness is reduced to 60–65 nm, and $V_{TN}$ and $V_{TP}$ are simultaneously set to $\pm 1$ V.

Adaptation of the present invention to even higher-voltage circuits (more than 22 volts) requires that the tank doping be lowered, to improve the junction breakdown of the source/drain junctions in the tank. This in turn requires other changes, such as a disproportionately deeper tank, a slightly lower channel stop dose, and a disproportionately thicker field oxide. Thus, the present invention does not scale as directly to such high voltage circuits, and the most important application of the present invention is to circuits between 9 and 22 volts.

The present invention has been described with primary reference to a double-well epitaxial structure. However, it will be obvious to those skilled in the art that the present invention can also be applied where different means of preventing latch-up are used. For example, N-wells doped to about $10^{16}$ cm$^{-3}$ could be used in a substrate doped to $2 \times 10^{15}$ cm$^{-3}$ P-type. Although guard rings would be used in this case, the invention can be otherwise practiced or described above.

What is claimed is:

1. A high-voltage CMOS product produced by the process, comprising the steps of:
    providing a silicon surface;
    providing N-type device regions in said surface;
    providing P-type device regions in said surface;
    depositing a moat masking layer on respective moat areas of said N-type and P-type device regions;
    applying a channel stop implant into portions both of said N-type device regions and also of said P-type device regions which are exposed by said moat masking layer, said channel stop implant comprising at least $5 \times 10^{12}$ cm$^{-2}$ of boron at an energy of at least 45 keV;
    selectively oxidizing said silicon surface where not masked by said moat masking layer;
    stripping said moat masking layer; and
    forming desired NMOS and PMOS devices in said respective moat regions.

2. The product produced by the process of claim 1, wherein said N-type device regions are doped with phosphorus in a concentration of at least $5 \times 10^{15}$ cm$^{-3}$.

3. The product produced by the process of claim 1, wherein said silicon surface comprises an epitaxial layer of silicon on a silicon substrate, said epitaxial layer having the same conductivity type as said substrate and said substrate being more heavily doped than said epitaxial layer.

4. The product produced by the process of claim 3, wherein said N-type device regions and said P-type device regions are both implanted into said epitaxial layer, and wherein said epitaxial layer and substrate are both P-type.

5. The product produced by the process of claim 4, wherein said N-type device regions are doped with phosphorus to a concentration of at least $5 \times 10^{15}$ cm$^{-3}$.

6. The product produced by the process of claim 5, wherein said P-type device regions are doped with boron to a concentration in the range of $1 \times 10^{15}$ per cm$^3$ to $5 \times 10^{15}$ per cm$^3$.

7. The product produced by the process of claim 4, further comprising the steps of:
    implanting selected portions of said P-type device regions with both phosphorus and arsenic, said implanted phosphorus and arsenic being implanted to approximately equal ranges; and
    annealling said implanted phosphorus and arsenic.

8. The product produced by the process of claim 3, wherein said step of providing N-type device regions comprises implanting an N-type impurity into said silicon surface to form a junction depth of at least $2\frac{1}{2}$ microns; and
    wherein said step of forming PMOS devices comprises implanting boron into selected areas of said N-type device regions and then annealling said boron, said boron implant forming a source/drain junction which is less than 30% as deep as the junction formed by the undersurface of said N-type device region.

9. The product produced by the process of claim 4, wherein said epitaxial layer has a depth at least three times the depth of said N-type device regions.

10. The product produced by the process of claim 9, further comprising the step of:

forming guard rings around the periphery of selected one of said N-type device regions, said guard rings comprising a heavy concentration of an N-type impurity.

11. A product produced by the process of forming desired CMOS circuits for operating at an operating voltage expressed as (10+x), where x is in the range between 0 and 10, comprising the steps:

providing a heavily doped P-type silicon substrate;

providing a P-type epitaxial layer on said substrate, said epitaxial layer having a thickness in microns of approximately 13+0.6x;

implanting N-type impurities to form N-tanks, said N-tanks having a surface dopant concentration of approximately $10^{16}$ per cm$^3$, and said tanks having a depth in microns of approximately 3+0.2x;

implanting P-wells into selected areas of said epitaxial layer, said P-wells having a dopant concentration of approximately $2 \times 10^{15}$ per cm$^3$;

depositing a moat masking layer on respective moat areas of said N-tanks and of said P-wells, where devices are to be formed;

applying a channel stop implant overall, said channel stop implant comprising at least $5 \times 10^{12}$ per cm$^2$ of boron at an energy of at least 50 keV;

selectively oxidizing said epitaxial layer where not masked by said moat masking layer, said oxidizing step being performed to form a field oxide having a thickness expressed in microns of at least 0.8+0.06x;

stripping said moat masking layer;

forming NMOS source/drain regions in said P-wells, and forming PMOS source/drain regions in said N-tanks, said source/drain regions having a maximum depth in microns of 0.5+0.05x, respective pairs of said source/drain regions defining channel regions therebetween, and said channel regions having a length expressed in microns which is not less than 3+0.4x;

depositing gate dielectrics atop said respective channel regions, said gate dielectrics having a minimum thickness expressed in nanometers of 60+4x; and depositing gates atop said respective gate dielectrics.

* * * * *